United States Patent
Lee et al.

(10) Patent No.: US 7,372,139 B2
(45) Date of Patent: May 13, 2008

(54) SEMICONDUCTOR CHIP PACKAGE

(75) Inventors: Hee-seok Lee, Hwaseong-si (KR);
Kyung-lae Jang, Seongnam-si (KR)

(73) Assignee: Samsung Electronics Co., Ltd.,
Gyeonggi-Do (KR)

( * ) Notice: Subject to any disclaimer, the term of this patent is extended or adjusted under 35 U.S.C. 154(b) by 16 days.

(21) Appl. No.: 11/108,794

(22) Filed: Apr. 19, 2005

(65) Prior Publication Data

US 2005/0230852 A1 Oct. 20, 2005

(30) Foreign Application Priority Data

Apr. 20, 2004 (KR) ............. 10-2004-0027190

(51) Int. Cl.
*H01L 23/52* (2006.01)

(52) U.S. Cl. ............. 257/685; 257/E23.079; 257/E23.069; 257/E23.07; 257/E23.172; 257/E23.061; 257/E23.101; 257/E23.114; 257/E23.126; 257/E23.065; 257/E25.03; 257/E25.023; 257/668; 257/723; 257/724; 257/728; 257/691; 257/690; 257/735; 257/528; 257/531

(58) Field of Classification Search ........ 257/E23.061, 257/E23.172, E23.07, E23.079, E23.069, 257/E23.101, E23.114, E23.126, E23.065, 257/E23.03, E25.023, 685, 668, 723, 724, 257/728, 698, 690–693, 686, 786, 784, 528, 257/531, 532, 691, 735, 787
See application file for complete search history.

(56) References Cited

U.S. PATENT DOCUMENTS 5,917,178 A * 6/1999 De Hoog ............. 235/492
6,674,157 B2 * 1/2004 Lang ............. 257/678
7,073,375 B2 * 7/2006 Parker et al. ............. 73/118.1
2003/0222282 A1 12/2003 Fjelstad et al.
2004/0264882 A1 * 12/2004 Torigoe et al. ............. 385/88
2005/0183884 A1 * 8/2005 Su ............. 174/257
2005/0184390 A1 * 8/2005 Gagne et al. ............. 257/738
2005/0286240 A1 * 12/2005 Sakamoto et al. ......... 361/803

FOREIGN PATENT DOCUMENTS

| JP | 60-030171 | | 2/1985 |
|---|---|---|---|
| JP | 07-030224 | | 1/1995 |
| JP | 9-128263 A | | 5/1997 |
| JP | 2005-116339 | * | 4/2005 |
| JP | 2005-321716 | * | 11/2005 |
| JP | 2006-32783 | * | 2/2006 |
| KR | 1020030006008 A | | 1/2003 |

OTHER PUBLICATIONS

Notice of Examination Report for corresponding Korean Application No. 10-2004-27190 dated Feb. 27, 2006.

* cited by examiner

*Primary Examiner*—Alexander Oscar Williams
(74) *Attorney, Agent, or Firm*—Harness, Dickey & Pierce, P.L.C.

(57) ABSTRACT

A semiconductor chip package may include a substrate, which may have bonding pads formed thereon. A semiconductor chip mounted on the substrate may have chip pads, and electrical connections for connecting the chip pads of the semiconductor chip to the substrate bonding pads. The semiconductor chip and the electrical connections on the substrate may be encapsulated, and a board attached to a portion of a surface of the substrate may not be encapsulated.

12 Claims, 7 Drawing Sheets

SEMICONDUCTOR CHIP PACKAGE

PRIORITY STATEMENT

This application claims priority under 35 U.S.C. § 119, from Korean Patent Application No. 10-2004-0027190 filed on Apr. 20, 2004 in the Korean Intellectual Property Office, the disclosure of which is incorporated herein by reference in its entirety.

BACKGROUND OF THE INVENTION

1. Field of the Invention

The present invention relates to semiconductor chip packages.

2. Description of the Conventional Art

Conventional art semiconductor packaging techniques for electrically and/or electronically connecting semiconductor chips to the external environment may include, for example, a Quad flat package (QFP) and/or a ball grid array (BGA) package.

A serializer/deserializer (SERDES) circuit may enable data transmission of a data rate, which may exceed, for example, a Gbps level.

Conventional art semiconductor packages, which employ the SERDES circuit, may be developed as, for example, BGA type packages.

FIG. 11 is a schematic view illustrating a structure in which a conventional semiconductor chip package may be connected to an external electronic device.

As shown in FIG. 11, a package 10 may be attached to a system board 20, and a board (e.g., a printed circuit board (PCB) or flexible PCB) connected to a connecter 40 of an external electronic device. The external electronic device may be a hard disk drive (HDD) 30, which may be connected to the system board 20.

The number of wiring patterns and the number of signal lines formed between the hard disk drive 30 and the board may be equal, or substantially equal.

Signal wirings may be used to transmit a data signal from the hard disk drive 30 to a semiconductor chip within the package 10. The signal wirings may be bonded to the system board 20 from a lower surface of the package 10, for example, by soldering on a circuit board 15 within the package 10.

As shown in FIG. 12, in which a conventional circuit wiring structure designed on the circuit board 15 is shown, all, or substantially all, of the circuit wirings of the circuit board 15 may be connected to the solder balls 11 through, for example, via holes. The number of the via holes may increase and the circuit wiring structure of the circuit board 15 may become more complex.

SUMMARY OF THE INVENTION

Example embodiments of the present invention provide semiconductor chip packages and/or semiconductor chip modules.

An example embodiment of the present invention may include a substrate, which may have a plurality of bonding pads. A semiconductor chip may be mounted on the substrate and may have a plurality of chip pads. Electrical connections may electrically connect the chip pads to the bonding pads, and a board may be attached to a portion of a surface of the substrate. The semiconductor chip and the electrical connection may be encapsulated and the portion, to which the board may be attached may not be encapsulated.

Another example embodiment of the present invention may include at least two semiconductor chip packages. The semiconductor chip packages may include a substrate, which may have a plurality of bonding pads. A semiconductor chip may be mounted on the substrate and may have a plurality of chip pads. Electrical connections may electrically connect the chip pads to the bonding pads, and a board, which may attach at least two semiconductor chip packages, may be attached to a portion of a surface of the substrate. The semiconductor chip and the electrical connection may be encapsulated and the portion, to which the board may be attached may not be encapsulated.

In example embodiments of the present invention, metal wirings formed on the board may be electrically connected to circuit wirings formed on the substrate.

In example embodiments of the present invention, the metal wirings formed on the board may be connected to the circuit wirings formed on the substrate through capacitive coupling.

In example embodiments of the present invention, the circuit wirings may be formed on at least one of an encapsulated and an unencapsulated portion of the substrate.

In example embodiments of the present invention, a material may be disposed between the board and the substrate. The material may allow signal transmission between the board and the substrate in the form of capacitive coupling.

In example embodiments of the present invention, the dielectric material may be a photo sensitive resist (PSR).

In example embodiments of the present invention, the dielectric material may be an adhesive bonding the board to the substrate.

In example embodiments of the present invention, the metal wirings formed on the board may be connected to the circuit wirings formed on the substrate through conductive bonding.

In example embodiments of the present invention, the board may be bonded to the substrate by an anisotropic conductive film.

In example embodiments of the present invention, the electrical connections may be bonding wires.

In example embodiments of the present invention, the electrical connections may be solder bumps and the semiconductor chip may be bonded to the substrate using flip chip bonding.

In example embodiments of the present invention, the board may include transmission channels for transmitting input/output signals of an external electronic device and input/output signals of the semiconductor chip.

In example embodiments of the present invention, the substrate may have a plurality of via holes.

In example embodiments of the present invention, the substrate may have a multi-layered structure.

In example embodiments of the present invention, the board may have metal wirings patterned thereon.

In example embodiments of the present invention, the metal wirings may be wiring pairs for differential signal transmission.

In example embodiments of the present invention, the metal wirings formed on the board may be capacitively coupled to the circuit wirings formed on the substrate.

In example embodiments of the present invention, metal wirings formed on the board may be connected to circuit wirings formed on the substrate of at least one of the at least two packages package along a portion, which may not be encapsulated by the package body.

BRIEF DESCRIPTION OF THE DRAWINGS

Example embodiments of the present invention will become more apparent by describing in detail the example embodiments thereof with reference to the attached drawings in which.

DETAILED DESCRIPTION OF THE EXAMPLE EMBODIMENTS OF THE PRESENT INVENTION

Figure 1:
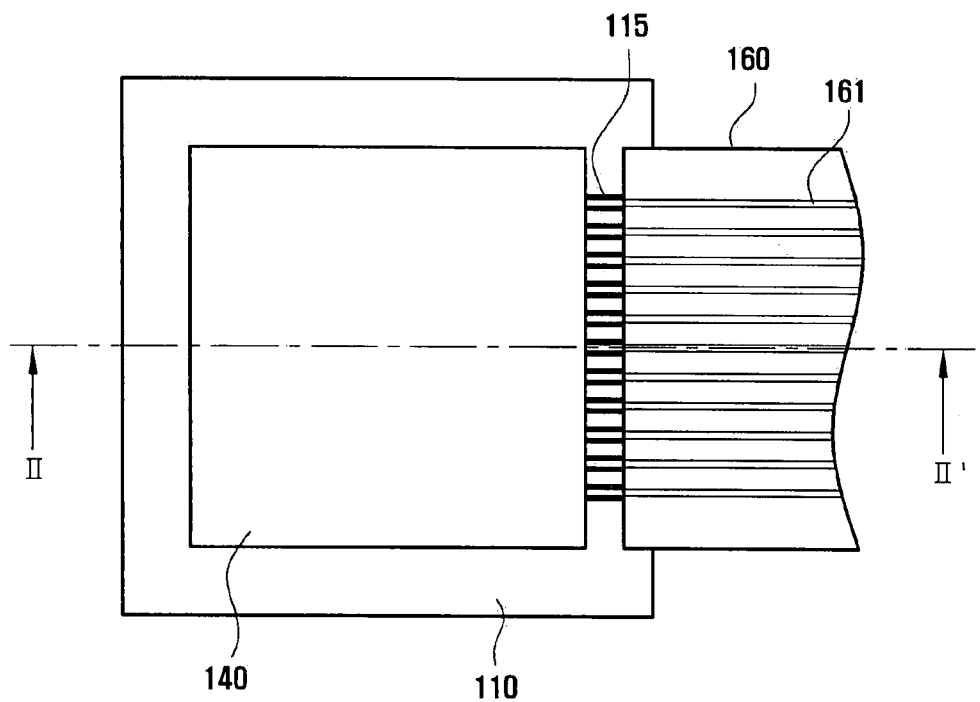
FIG. 1 is a plan view of a semiconductor chip package according to an example embodiment of the present invention.

Example embodiments of the present invention may be understood more readily by reference to the following detailed description of example embodiments and the accompanying drawings. Example embodiments of the present invention may, however, be embodied in many different forms and should not be construed as being limited to the example embodiments set forth herein. Rather, these example embodiments are provided so that this disclosure will be thorough and complete and will fully convey the concept of the present invention to those skilled in the art, and the present invention will only be defined by the appended claims. Like reference numerals refer to like elements throughout the specification.

A semiconductor chip package according to an example embodiment of the present invention will now be described with reference to FIGS. 1 and 2.

Figure 2:
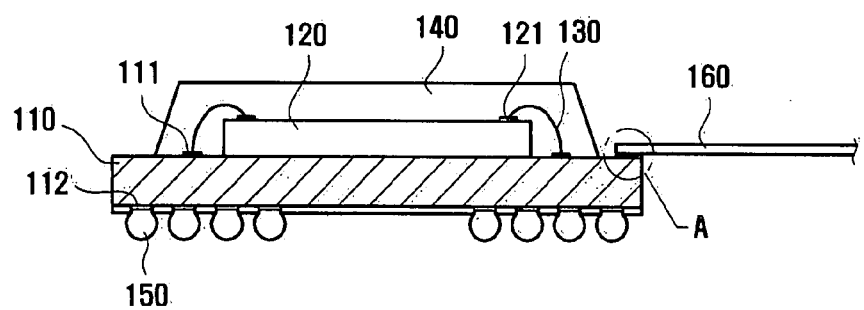
FIG. 2 is a cross-sectional view taken along a line II-II' of FIG. 1.

FIG. 1 is a plan view of a semiconductor chip package according to an example embodiment of the present invention, and FIG. 2 is a cross-sectional view taken along a line II-II' of FIG. 1.

In a semiconductor chip package according to an example embodiment of the present invention, as shown in FIGS. 1 and 2, a semiconductor chip 120 may be attached to a substrate 110. The substrate 110 may have one or more bonding pads (e.g., substrate bonding pads) 111 formed on, for example, an upper surface thereof and one or more terminals 112 formed on, for example, a lower surface thereof. However, the bonding pads 111 and/or the terminals 112 may be formed on any surface of the substrate 110.

The substrate 110 may be, for example, a molded frame (e.g., a molded lead frame), a board (e.g., a printed circuit board (PCB) or flexible PCB), direct bond copper (DBC), a flexible film, or any other suitable substrate. The DBC may be, for example, an insulating ceramic substrate, which may have copper layers attached on one or both surfaces thereof.

In another example, an interposer providing an electrical connection and/or mechanical flexibility between a semiconductor chip and a substrate of an assembly (e.g., a personal computer) may be used as the substrate 110. The interposer may be made of an elastic material such as, for example, a tape, polyimide, plastic material, or any other suitable material. The interposer may include a single or multiple patterned re-wiring layers, and a passive element (e.g., a capacitor, a resistor, or the like).

The semiconductor chip 120 may have an active surface and an inactive surface, for example, opposite the active surface. The active surface may have a plurality of chip pads 121 located on, for example, an upper surface. The inactive surface may be used in attaching the semiconductor chip 120. The chip pads 121 of the semiconductor chip 120 may be connected (e.g., electrically connected) to the bonding pads (e.g., substrate bonding pads) 111 by wires (e.g., bonding wires) 130.

The semiconductor chip 120, the wires 130, and adhered portions of the wires 130 may be encapsulated in a package body 140. A portion of the substrate 110, for example, one or more edges of the substrate 110, may not be encapsulated by the package body 140, and may be exposed.

The package body 140 may be formed of a material such as, for example, epoxy molding resin (EMC) or any other suitable encapsulating material. Solder balls 150, may serve as connection terminals (e.g., external connection terminals), and may be attached to the terminals 112 of the substrate 110.

A board (e.g., a printed circuit board (PCB) or flexible PCB) 160 may be attached to a side of a portion (e.g., an upper portion) of the substrate 110, which may not be encapsulated by the package body 140.

The board 160 may have metal wirings 161, which may be patterned on a film (e.g., a flexible film), and may provide transmission channels for input/output of an external device (e.g., external electronic device) and/or the semiconductor chip 120, which may enable reception and/or transmission of data between the external device and the semiconductor chip 120.

The metal wirings 161 may be connected to the bonding pads 111 through circuit wirings 115 formed on the substrate 110 so that they may be connected (e.g., electrically connected) to the semiconductor chip 120.

The solder balls 150 may also be connected to the bonding pads 111 through circuit wirings 115 formed on the substrate 110, and may be connected (e.g., electrically connected) to the semiconductor chip 120.

In an example embodiment, the circuit wirings 115 may be formed on, for example, a portion (e.g., the right) of an upper surface of the substrate 110, which may be an exposed portion of the substrate 110. However, the circuit wirings may be formed on any portion of the substrate 110. The substrate 110 may have multiple layers, and the circuit wirings 115 may be formed on one or more layers of the substrate 110. The substrate 110 may have a multi-layered structure, and the substrate 110 may have multiple via holes so as to connect (e.g., electrically connect) the circuit wirings 115, which may be formed on the one or more layers, with one another. The solder balls 150 may be connected (e.g., electrically connected) to the circuit wirings 115, which may be connected through the via holes.

In an example embodiment of the present invention, the chip pads 121 may be connected (e.g., electrically connected) to the bonding pads (e.g., substrate bonding pads) 111 by the wires (e.g., bonding wires) 130. However, the chip pads 121 of the semiconductor chip 120 may be connected (e.g., electrically connected) to the bonding pads (e.g., substrate bonding pads) 111, for example, through bumps, or any other suitable connection. The bumps may be formed through, for example, flip chip bonding.

An example structure, in which the semiconductor chip package according to an example embodiment of the present invention may be connected to the external device (e.g., external electronic device), will be described in more detail with reference to FIG. 3, and an example structure, in which the board 160 may be attached to the substrate 110, will then be described in detail with reference to FIGS. 4B and 4C.

Figure 3:
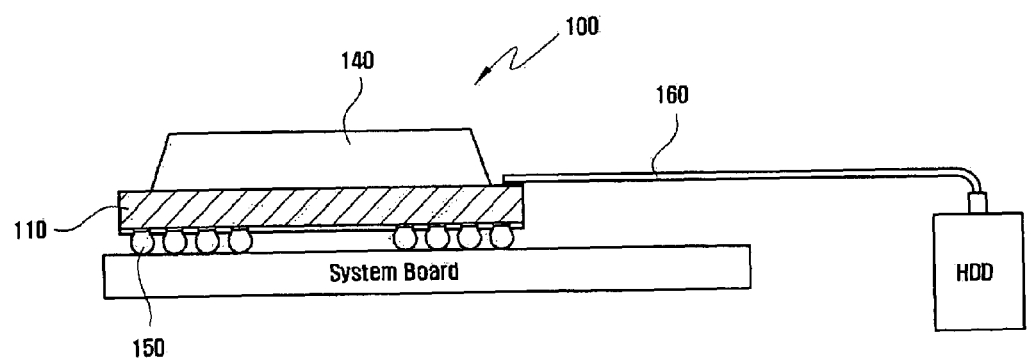
FIG. 3 is a schematic view showing an example structure in which the semiconductor chip package according to an example embodiment of the present invention may be connected to an external device.

As shown in FIG. 3, the semiconductor chip package 100 according to an example embodiment of the present invention may be attached to a system board.

The solder balls 150, which may be formed, for example, on the lower surface of the package 100, may be attached to the system board, for example, by soldering, and may be connected (e.g., electrically connected) to circuit wirings (not shown in FIG. 3) printed on the system board.

The board 160 may be attached to a portion of, for example, the upper part of the substrate 110, which may not be encapsulated by the package body 140. The board 160 may be connected to a connector of the external device (e.g., external electronic device). The external device may be, for example, a hard disk drive (HDD), or any other suitable external device.

The external device (e.g., an external electronic device) may supply a signal (e.g., a serial data signal or any other suitable signal). The substrate 110, which may be included in the semiconductor package 100 may have, for example, an interconnection design for input/output of a signal. The signal may be a higher-speed signal (e.g., a serial data signal or the like).

The semiconductor chip package 100 according to example embodiments of the present invention may have, for example, a multi-layered substrate, which may accommodate an increased number of circuit wirings.

In the semiconductor chip package 100, according to example embodiments of the present invention, input/output wirings, which may include circuit wirings 115 for higher-speed signal input/output, may be formed on the substrate 110 (e.g., multi-layered substrate). The circuit wirings 115 for signal (e.g., higher-speed signal) input/output may be formed on, for example, an upper layer of the substrate 110. The circuit wirings 115 for signal (e.g., higher-speed signal) input/output may be connected to input/output ports of the electronic device through the board 160. The input/output wirings remaining may be formed on, for example, each layer of the substrate 110, and may be connected to solder balls through, for example, via holes.

Figure 4A:
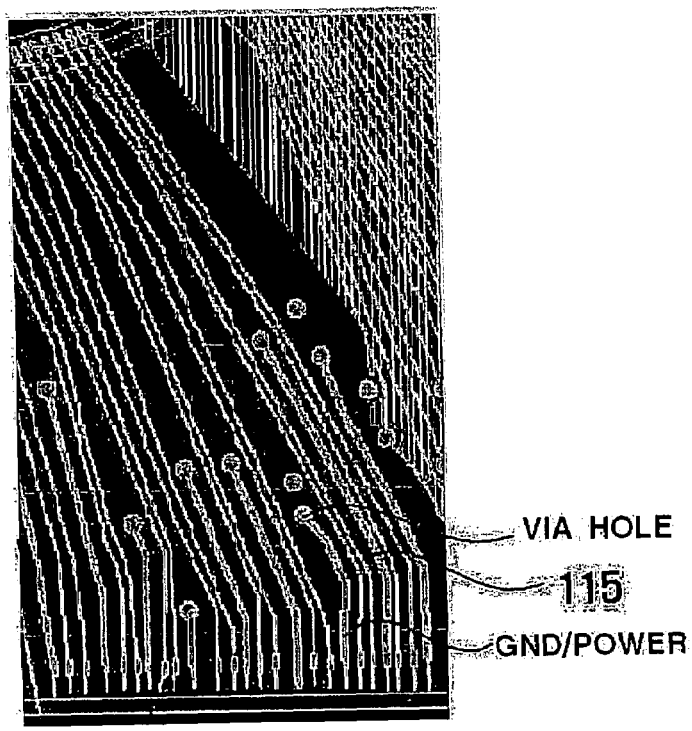
FIG. 4A shows an example circuit wiring structure of the semiconductor chip package according to an example embodiment of the present invention.

FIG. 4A illustrates an example structure (e.g., an example circuit wiring structure) of the semiconductor chip package according to an example embodiment of the present invention. The circuit wirings 115 for signal (e.g., higher-speed signal) input/output may be connected directly, or indirectly, to the board 160. The substrate 110 may be connected to GND/power, for example, using via holes, which may supply more stable power for operation (e.g., higher-speed operation) of a semiconductor chip.

The circuit wiring 115 for signal (e.g., higher-speed signal) input/output may include, for example, one or more wirings (e.g., differential signal wirings), which may be used as data buses (e.g., serial data buses). The one or more wirings (e.g., differential signal wirings) may be designed on the substrate 110 such that a distance between each of the one or more wirings (e.g., differential signal wirings) may be such that crosstalk, which may affect the wirings (e.g., differential signal wirings), may be suppressed.

Figure 4B:
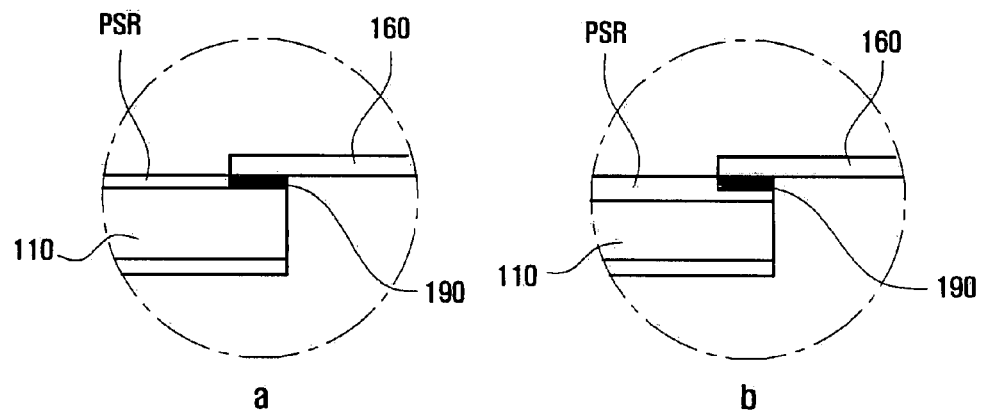
FIG. 4B shows various example embodiments and an enlarged cross-sectional view of a portion "A" shown in FIG. 2.

FIG. 4B shows various example embodiments and an enlarged cross-sectional view of a portion "A" shown in FIG. 2. FIG. 4C is a plan view showing an adhered portion between a board and a substrate as shown in FIG. 1.

A photo sensitive resist (PSR) (not shown) in FIGS. 1 and 2, may be coated on the upper surface of the substrate 110, which may include the circuit wirings 115.

Figure 4C:
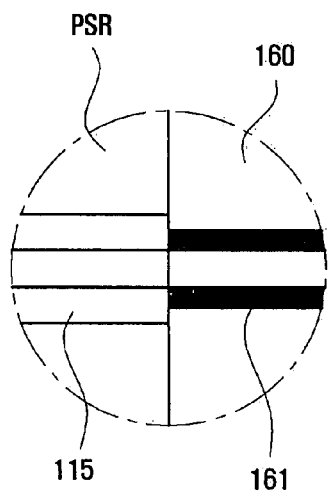
FIG. 4C is a plan view showing an example adhered portion between a board and a substrate shown in FIG. 1.

As shown in FIGS. 4B and 4C, the board 160 may have metal wirings 161 formed thereon and the package substrate 110 may have the circuit wirings 115 formed thereon. The board 160 and the substrate 110 may be bonded to each other using, for example, an adhesive (e.g., an insulating adhesive or any other suitable adhesive) 190. The metal wirings 161 and the circuit wirings 115 may be used as one or more wiring pairs (e.g., differential signal wiring pairs) for transmission of data (e.g., serial data or the like).

The metal wirings 161 and the circuit wirings 115 may be connected (e.g., electrically connected) through coupling (e.g., capacitive coupling) using the adhesive (e.g., the insulating adhesive) 190 interposed therebetween.

The wirings 161 and 115 may be connected through coupling (e.g., capacitive coupling), and DC-component of a signal (e.g., higher-speed signal) may be blocked (e.g., DC-blocked).

A connection (e.g., an electrical connection) may also serve as an adhesive (e.g., insulating adhesive or a dielectric material adhesive), and need not have an additional bonding process (e.g., metal bonding process) to form a contact (e.g., conductive contact).

For example, a PSR coated on the substrate 110 may be used as a dielectric material of a capacitor. The PSR, for example, may be at least partially exposed, and may be bonded. The dielectric material may also be any suitable material other than PSR.

As shown in FIG. 4B, the PSR may be removed from the adhered portion between the board 160 and the substrate 110, and the board 160 and the substrate 110 may be connected (e.g., electrically connected) to each other through coupling (e.g., capacitive coupling), for example, using the adhesive (e.g., insulating adhesive) 190. The adhesive (e.g., insulating adhesive) 190 may be a dielectric material, which may have a higher dielectric constant.

As shown in FIG. 4B, the PSR may be at least partially removed from the adhered portion between the board 160 and the substrate 110, which may make the PSR thinner, and the adhesive (e.g., insulating adhesive) 190 may be coated on the remaining PSR, such that the board 160 and the substrate 110 may be connected (e.g., electrically connected) to each other in the form of coupling (e.g., capacitive coupling). The adhesive (e.g., insulating adhesive) 190 may be a dielectric material, which may have a higher dielectric constant.

The board 160 may be attached to the PSR formed on the substrate 110 such that the board 160 and the substrate 110 may be connected (e.g., electrically connected) to each other in the form of coupling (e.g., capacitive coupling). The board 160 and the substrate 110 may be adhered to each other, for example, using an adhesive material, which may be insulating or conductive.

As shown FIG. 4b, the PSR formed on the substrate 110 may be thinned, for example, by being partially removed, and the board 160 may be attached to the PSR, which may provide a connection (e.g., an electrical connection) between the board 160 and the substrate 110 through coupling (e.g., capacitive coupling).

The board 160 and the substrate 110 may be connected (e.g., electrically connected) to each other, for example, by an adhesive material, which may be insulating or conductive.

A semiconductor chip package according to an example embodiment of the present invention will be explained with reference to FIGS. 5 and 6.

Figure 5:
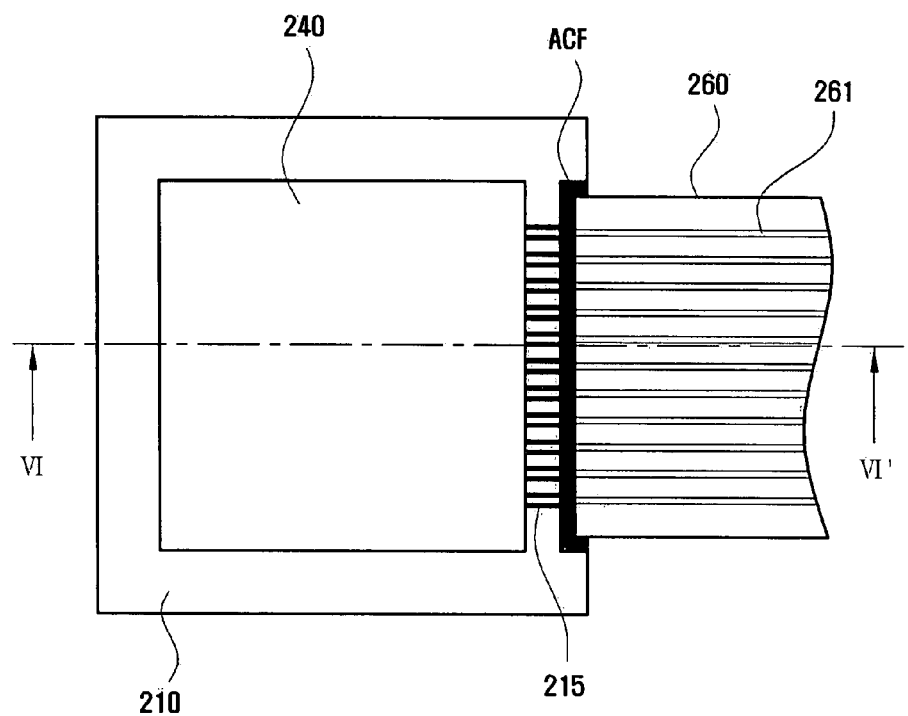
FIG. 5 is a plan view of a semiconductor chip package according to an example embodiment of the present invention.
Figure 6:
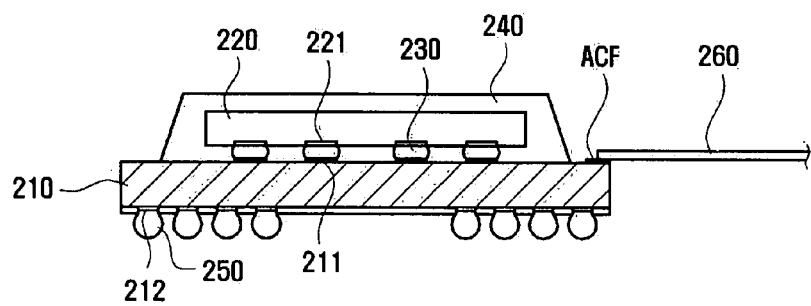
FIG. 6 is a cross-sectional view taken along a line VI-VI' of FIG. 5.

FIG. 5 is a plan view of the semiconductor chip package according to an example embodiment of the present invention, and FIG. 6 is a cross-sectional view taken along a line VI-VI' of FIG. 5.

In the semiconductor chip package according to an example embodiment of the present invention, as shown in FIGS. 5 and 6, a semiconductor chip 220 may be attached on a substrate 210 having a plurality of bonding pads (e.g., substrate bonding pads) 211 formed on, for example, an upper surface and a plurality of terminals 212 formed on, for example, a lower surface. However, the bonding pads (e.g., substrate bonding pads) 211 and the terminals 212 may be formed on any surface of the substrate.

The substrate 210 may be, for example, a molded frame (e.g., a molded lead frame), a board (e.g., a printed circuit board (PCB) or flexible PCB), a direct bond copper (DBC), a film (e.g., a flexible film), or any other suitable substrate. The DBC may refer to an insulating substrate (e.g., an insulating ceramic substrate), which may have one or both surfaces adhered with, for example, copper layers, although any suitable conductive material may be used.

An interposer, which may provide a connection (e.g., electrical connection) and/or flexibility (e.g., mechanical flexibility) between a semiconductor chip and a substrate of an assembly (e.g., a personal computer) may also be used as the substrate 210. The interposer may be made of a material such as a tape, polyimide, a plastic material, or any other suitable material. The interposer may include a single or multiple patterned re-wiring layers, and a passive element (e.g., a capacitor, a resistor, etc.).

The semiconductor chip 220 may have an active surface. The active surface may have a plurality of chip pads 221 located on a bottom surface. The chip pads 221 of the semiconductor chip 220 may be connected (e.g., electrically connected) to the bonding pads (e.g., substrate bonding pads) 221, for example, by solder bumps 230, which may provide, a structure (e.g., a flip chip bonding structure).

The semiconductor chip 220, which may be disposed on an upper part of the substrate 110, the solder bumps 230, and adhered portions of the solder bumps 230 may be encapsulated by a package body 240.

A portion of the substrate 220, for example, one or more edges of the substrate 220, may not be encapsulated with the package body 240 and may be exposed.

The package body 240 may be formed of a material such as an elastic memory composite material (EMC), or any other suitable encapsulating material.

Solder balls 250, which may serve as connection terminals (e.g., external connection terminals), may be attached to the terminals 212 of the substrate 210.

A board (e.g., a printed circuit board (PCB) or flexible PCB) 260 may be attached, for example, to the unencapsulated portion of the substrate 210.

The board 260 may be attached to the substrate 210, for example, by an anisotropic conductive film (ACF) or any other suitable adhesive material.

The board 260 may have metal wirings 261, which may be patterned on a film (e.g., flexible film), and may provide transmission channels between input/output ports of an external device (e.g., external electronic device) and input/output ports of the semiconductor chip 220. The input/output ports of the external device and the semiconductor chip 220 may enable reception and/or transmission of data between the external device (e.g., external electronic device) and the semiconductor chip 220 within the package.

The metal wirings 261 may be connected to the bonding pads (e.g., substrate bonding pads) 211 through circuit wirings 215, which may be formed on the substrate 210 such that they may be connected (e.g., electrically connected) to the semiconductor chip 220. The metal wirings 261 may conductively contact the circuit wirings 215 formed on the substrate 210 through, for example, an ACF or any other suitable conductive adhesive.

While example embodiments of the present invention have been discussed with regard to an ACF, it will be understood that any suitable conductive adhesive capable of conductively connecting the metal wirings 261 to the circuit wirings 215 formed on the substrate 210. Capacitive coupling may also be employed to provide a connection (e.g., an electrical connection) between the metal wirings 261 and the circuit wirings 215.

The solder balls 250 may be connected to the bonding pads (e.g., substrate bonding pads) 211 through circuit wirings 215 formed on the substrate 210, and may be connected (e.g., electrically connected) to the semiconductor chip 220.

The circuit wirings 215 may be formed, for example, on the right of an upper surface of the substrate 210, which may be an exposed (i.e., unencapsulated) portion of the substrate 210. However, the circuit wirings 215 may also be formed on any other portion or portions of the substrate 210. The substrate 210 may have one or more layers, and the circuit wirings 215 may be formed on respective layers of the substrate 210.

The substrate 210 may have a multi-layered structure, and the substrate 210 may have multiple via holes so as to connect (e.g., electrically connect) the circuit wirings 215 formed on the respective layers with one another, and the solder balls 250 may be connected (e.g., electrically connected) to the respective circuit wirings 215 connected through the via holes.

In an example embodiment of the present invention, the chip pads 221 may be connected (e.g., electrically connected) to the bonding pads substrate bonding pads 211 by the wires (e.g., bonding wires) 230. In another example embodiment, the chip pads 221 of the semiconductor chip 220 may be connected (e.g., electrically connected) to the bonding pads (e.g., substrate bonding pads) 211 through wires (e.g., bonding wires) 230.

A semiconductor chip package according to another example embodiment of the preset invention is explained with reference to FIGS. 7 and 8.

Figure 7:
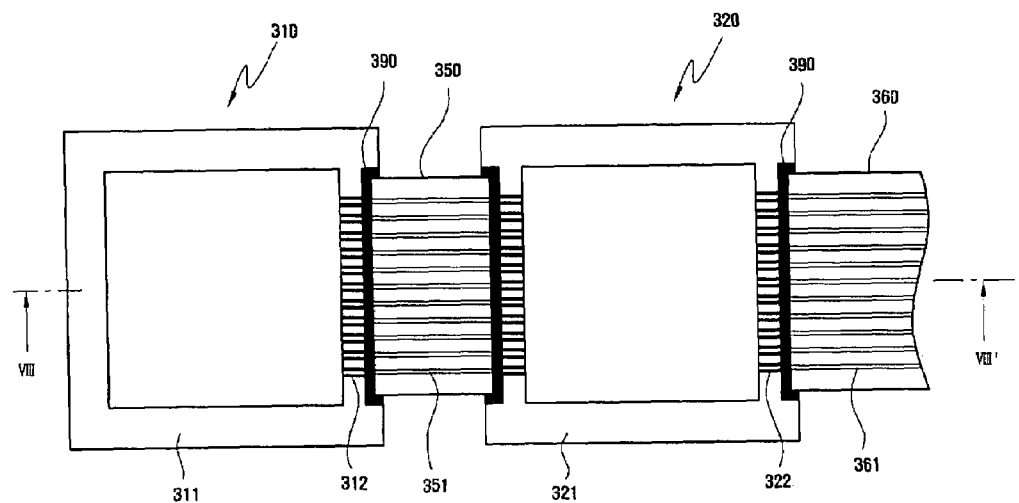
FIG. 7 is a plan view of a semiconductor chip package according to another example embodiment of the present invention.
Figure 8:
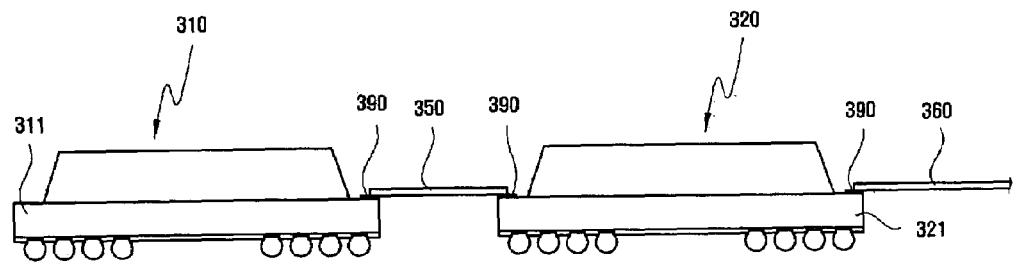
FIG. 8 is a cross-sectional view taken along a line VIII-VIII' of FIG. 7.

FIG. 7 is a plan view of the semiconductor chip package according to another example embodiment of the present invention, and FIG. 8 is a cross-sectional view taken along a line VIII-VIII' of FIG. 7.

As shown in FIGS. 7 and 8, the semiconductor chip package according to an example embodiment of the present invention may have two or more semiconductor packages, which may have the same, or substantially the same, structure as the semiconductor chip package as described with regard to FIGS. 1-6. The semiconductor chip packages may be connected to each another.

Semiconductor packages 310 and 320, which may be connected to a board (e.g., a printed circuit board (PCB) or flexible PCB) 350, and a board (e.g., a printed circuit board (PCB) or flexible PCB) 360. The boards 350 and 360 may be connected to the right of the second package 320 and an external device (e.g., external electronic device).

Substrates 311 and 321 of the packages 310 and 320 may be bonded to the boards 350 and 360, for example, by an adhesive 390, which may be conductive or insulating.

The adhesive 390 may be a conductive adhesive, and circuit wirings 312 and 322, formed on the substrates 311 and 321, may be connected to metal wirings 351 and 361, formed on the boards 350 and 360, in the form of coupling (e.g., conductive coupling).

An anisotropic conductive film (ACF), or any other conductive adhesive material may be used as the conductive adhesive.

The adhesive 390 may be an insulating adhesive, and the circuit wirings 312 and 322 formed on the substrates 311 and 321 may be connected to the metal wirings 351 and 361 formed on the boards 350 and 360 in the form of coupling (e.g., capacitive coupling). The insulating adhesive may be a dielectric material in a capacitor with the PSR (not shown) coated on the substrate 311 and 321 The PSR may be at least partially exposed (i.e., unencapsulated) and bonded.

A semiconductor chip package according to another example embodiment of the preset invention will be explained with reference to FIGS. 9 and 10.

Figure 9:
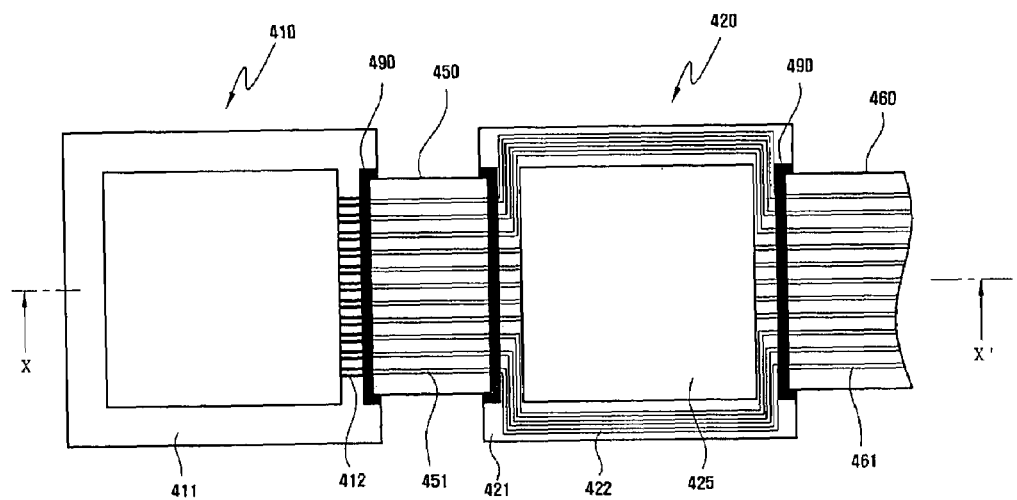
FIG. 9 is a plan view of a semiconductor chip package according to an example embodiment of the present invention.
Figure 10:
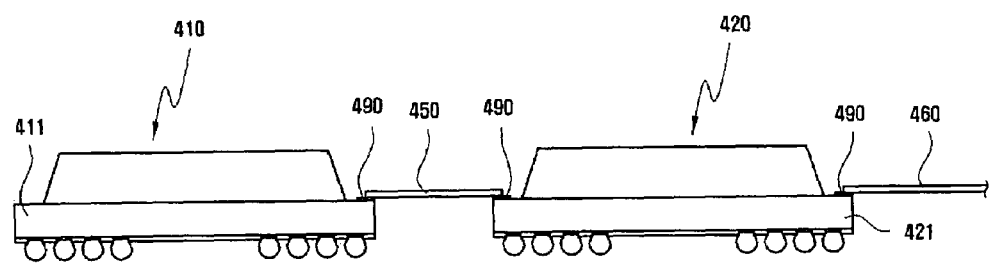
FIG. 10 is a cross-sectional view taken along a line X-X' of FIG. 9.
Figure 11:
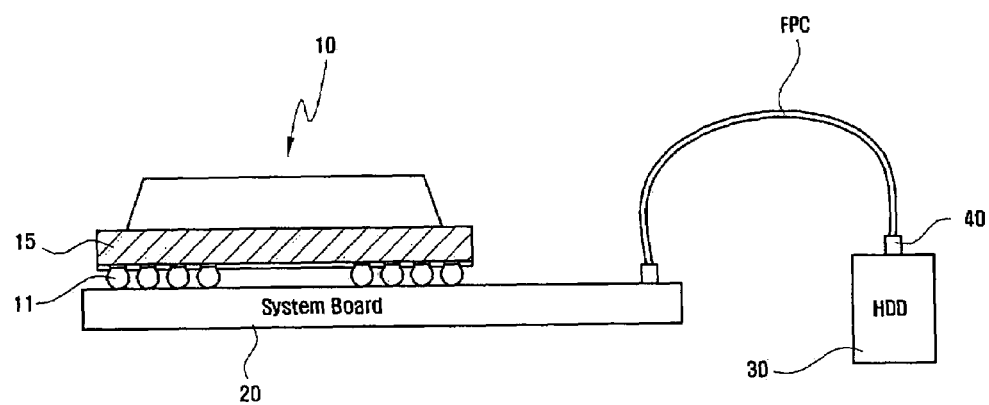
FIG. 11 schematically shows an example structure in which a conventional semiconductor chip package may be connected to an external device.
Figure 12:
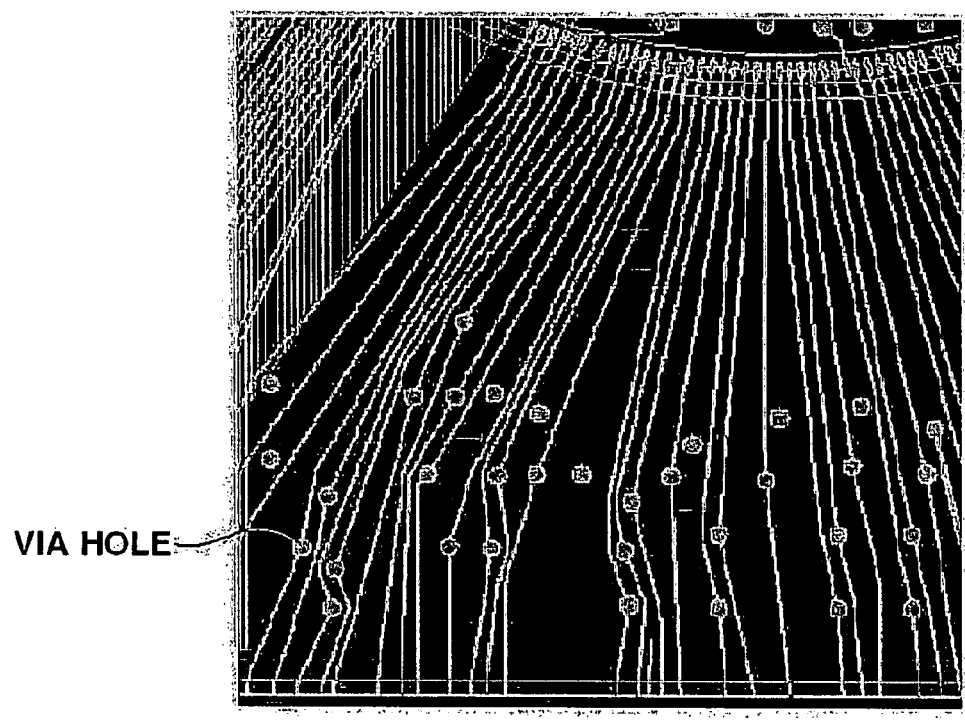
FIG. 12 shows a conventional circuit wiring structure designed on a board.

FIG. 9 is a plan view of the semiconductor chip package according to an example embodiment of the present invention, and FIG. 10 is a cross-sectional view taken along a line X-X' of FIG. 9.

As shown in FIGS. 9 and 10, the semiconductor chip package according to an example embodiment of the present invention may have two or more semiconductor chip packages, which may be connected to each other by boards (e.g., printed circuit boards (PCB) or flexible PCBs) 450 and 460. The semiconductor chip package according to an example embodiment of the present invention may be the same, or substantially the same, as the semiconductor chip package as described with regard to FIGS. 7 and 8, however, the structure of circuit wirings 422 formed on a second package substrate may differ.

Packages 410 and 420 may be connected to the board 450, and an external device (e.g., external electronic device) may be connected to the board 460 connected to the right of the second package 420.

Substrates 410 and 420 of the boards 450 and 460 may be bonded to the packages 410 and 420 by an adhesive 390, which may be conductive or insulating.

Circuit wirings 422, which may be connected to metal wirings 461 formed on the board 460, may be formed, for example, on an upper layer of the substrate 421. One or more of the circuit wirings 422 may be led, for example, to the inside of a package body 425, and the remaining circuit wirings may be formed on a portion of the substrate 421, which may be exposed.

The substrate 421 of the package 420 may provide channel paths for data signals supplied from an external device (e.g., external electronic device), for example, when data signals are transmitted to semiconductor chips of the package 410.

The boards 450 and 460 may be bonded to the substrates 411 and 421, respectively, for example, using an adhesive (e.g., conductive adhesive). The circuit wirings 412 and 422, formed on the substrates 411 and 421, may be connected to the metal wirings 451 and 461, formed on the boards 450 and 460, through, for example, coupling (e.g., conductive coupling). An anisotropic conductive film (ACF), or any other suitable conductive adhesive material, may be used as the conductive adhesive.

The adhesive may be insulating, and the circuit wirings 412 and 422 formed on the substrates 411 and 421, may be connected to the metal wirings 451 and 461, formed on the boards 450 and 460 in the form of, for example, coupling (e.g., capacitive coupling). The insulating adhesive may serve as a dielectric material of a capacitor with the PSR (not shown) coated on the substrates 411 and 421. The PSR, for example, may be partially exposed (i.e., unencapsulated) and bonded.

As described above, the semiconductor chip package according to the example embodiments of the present invention may be connected (e.g., electrically connected) to a device (e.g., electronic device) for a signal (e.g., higher-speed signal) and/or another package and need not pass through solder balls of the package.

Circuit wirings connected to solder balls may be designed less densely, and additional solder balls, which may not be used for interconnection, may be used as power and/or ground signal wirings, thereby supplying more stable power for operation (e.g., higher-speed operation) of a semiconductor chip. Crosstalk between each of signal (e.g., differential signal) wiring pairs designed within the package may be suppressed.

Circuit wirings 115 may be designed on the substrate of the package such that the circuit wirings 115 may be connected to solder balls less densely. Extra solder balls may be used, for example, as ground (GND)/power wirings, and a more stable power level for operation (e.g., high-speed operation) of a semiconductor chip may be supplied.

In an example embodiment of the present invention, one or more circuit wirings formed on a substrate may be directly connected to metal wirings formed on a board, which may reduce the number of the circuit wirings connected to solder balls of the package.

The circuit wirings connected to the solder balls may be arranged less densely, and additional solder balls may be used as power and/or ground signal wirings, which may supply more stable power for operation (e.g., higher-speed operation) of a semiconductor chip.

A connection (e.g., electrical connection) between the board and the substrate in the form of coupling (e.g., capacitive coupling) may be formed by bonding the board to the substrate using, for example, an adhesive (e.g., an insulating adhesive) and a DC-component of a signal (e.g., higher-speed signal) may be blocked.

Although several example embodiments of the present invention have been described with respect to certain characteristics, it will be understood that these characteristics may be interchangeable and/or modifiable between example embodiments of the present invention.

While example embodiments of the present invention have been particularly shown and described, it will be understood by those skilled in the art that the foregoing and other changes in form and details may be made therein without departing from the spirit and scope of the invention which should be limited only by the scope of the appended claims. Thus, example embodiments of the present invention disclosed above are used in a generic and descriptive sense only and not for purposes of limitation.

What is claimed is:

1. A semiconductor chip package, comprising:
   a substrate having a plurality of bonding pads;
   a semiconductor chip mounted on the substrate and having a plurality of chip pads;
   electrical connections for electrically connecting the chip pads of the semiconductor chip to the substrate bonding pads;
   a board attached to a portion of a surface of the substrate;
   a plurality of metal wirings formed on the board; and
   a plurality of circuit wirings formed on the substrate,
   wherein the metal wirings and the circuit wirings are electrically connected by capacitive coupling, and
   the semiconductor chip and the electrical connections are encapsulated and the portion is not encapsulated.

2. The semiconductor chip package of claim 1, further comprising a dielectric material disposed between the board and the substrate for allowing signal transmission between the board and the substrate in the form of capacitive coupling.

3. The semiconductor chip package of claim 2, wherein the dielectric material is a photo sensitive resist.

4. The semiconductor chip package of claim 2, wherein the dielectric material is an adhesive material.

5. The semiconductor chip package of claim 1, wherein the board includes transmission channels for transmitting input/output signals of an external electronic device and input/output signals of the semiconductor chip.

6. The semiconductor chip package of claim 3, wherein the metal wirings are wiring pairs for differential signal transmission.

7. A semiconductor chip package, comprising:
   at least two semiconductor chip packages;, wherein at least one of the semiconductor chip packages further includes,
   a substrate having a plurality of substrate bonding pads,
   a semiconductor chip mounted on the substrate and having a plurality of chip pads,
   electrical connections for electrically connecting the chip pads of the semiconductor chip to the substrate bonding pads,
   a board attached to a portion of a surface of the substrate,
   a plurality of metal wirings formed on the board; and
   a plurality of circuit wirings formed on the substrate,
   wherein the metal wirings and the circuit wirings are electrically connected by capacitive coupling, and
   the semiconductor chip and the electrical connections are encapsulated and the portion to which the board is attached is not encapsulated, and
   the board connects the at least two packages.

8. The semiconductor chip package of claim 7, further comprising a dielectric material disposed between the board and the substrate for allowing signal transmission between the board and the substrate in the form of capacitive coupling.

9. The semiconductor chip package of claim 8, wherein the dielectric material is a photo sensitive resist.

10. The semiconductor chip package of claim 8, wherein the dielectric material is an adhesive material.

11. A semiconductor chip package, comprising:
    a substrate having a plurality of bonding pads;
    a semiconductor chip mounted on the substrate and having a plurality of chip pads;
    electrical connections for electrically connecting the chip pads of the semiconductor chip to the substrate bonding pads;
    a board attached to a portion of a surface of the substrate;
    a plurality of metal wirings formed on the board; and
    a plurality of circuit wirings formed on the substrate,
    wherein the metal wirings and the circuit wirings are electrically connected by anisotropic conductive film, and
    the semiconductor chip and the electrical connections are encapsulated and the portion is not encapsulated.

12. A semiconductor chip package, comprising:
    at least two semiconductor chip packages, wherein at least one of the semiconductor chip packages further includes,
    a substrate having a plurality of substrate bonding pads,
    a semiconductor chip mounted on the substrate and having a plurality of chip pads,
    electrical connections for electrically connecting the chip pads of the semiconductor chip to the substrate bonding pads,
    a board attached to a portion of a surface of the substrate,
    a plurality of metal wirings formed on the board; and
    a plurality of circuit wirings formed on the substrate,
    wherein the metal wirings and the circuit wirings are electrically connected by anisotropic conductive film,
    the semiconductor chip and the electrical connections are encapsulated and the portion to which the board is attached is not encapsulated, and
    the board connects the at least two packages.

* * * * *